United States Patent
Kwon

(10) Patent No.: US 6,560,162 B2
(45) Date of Patent: May 6, 2003

(54) MEMORY CELL DECODER NOT INCLUDING A CHARGE PUMP

(75) Inventor: Seok-cheon Kwon, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/010,625

(22) Filed: Nov. 8, 2001

(65) Prior Publication Data

US 2002/0110040 A1 Aug. 15, 2002

(30) Foreign Application Priority Data

Nov. 18, 2000 (KR) ............................................ 00-68729

(51) Int. Cl.[7] .............................................. G11C 8/00
(52) U.S. Cl. ............................ 365/230.06; 365/230.03; 365/185.11
(58) Field of Search ..................... 365/230.06, 185.11, 365/230.03

(56) References Cited

U.S. PATENT DOCUMENTS 5,654,930 A * 8/1997 Yoo et al. ............... 365/230.06
5,751,643 A * 5/1998 Lines ..................... 365/230.06

* cited by examiner

Primary Examiner—Huan Hoang
(74) Attorney, Agent, or Firm—Marger Johnson & McCollom P.C.

(57) ABSTRACT

A memory cell decoder includes a first node and a first transmitting portion adapted to output a high voltage signal to the first node responsive to a first selection signal. A control portion is adapted to generate a first control signal responsive to an address and discharge the first node responsive to the first control signal. A second transmitting portion is adapted to output a word line enable signal responsive to the first selection signal and the first control signal. A semiconductor memory device includes: a memory cell array having an array of memory cells; a plurality of word lines corresponding to the memory cells; a plurality of memory cell decoders adapted to select word lines responsive to an address; a first pre decoder adapted to decode the address and generate a plurality of block selection signals, the block selection signals selecting predetermined corresponding blocks in the memory cell decoders; a second pre decoder adapted to generate a plurality of word line enable signals responsive to the address, the word line enable signals for enabling corresponding word lines responsive to the address.

28 Claims, 6 Drawing Sheets

MEMORY CELL DECODER NOT INCLUDING A CHARGE PUMP

This application claims priority from Korean Patent Application No. 00-68729, filed Nov. 18, 2000.

BACKGROUND OF THE INVENTION

1. Field of the Invention

The present invention relates to a non-volatile memory device and, more particularly, to a memory cell decoder not including a charge pump, a non-volatile semiconductor memory device including the memory cell decoder, and a method for supplying a high voltage to a memory cell array of the non-volatile semiconductor memory device.

2. Description of the Related Art

A non-volatile semiconductor memory device needs a voltage (for example, 20V) higher than a supply voltage Vcc supplied to read, write, or program data.

Non-volatile semiconductor memory devices include an array of memory cells. Each memory cell, in turn, comprises a memory cell transistor. In the memory cell transistor, a source and a drain are formed on both sides of a semiconductor substrate. A gate polysilicon is formed on the semiconductor substrate. A floating gate is formed on the gate polysilicon. A gate insulating film is stacked on the floating gate. A control gate is stacked on the gate insulating film.

When data is written into a cell or when a cell is programmed, ground (for example, 0V) is applied to the source, the drain, and the substrate. When a voltage higher than the supply voltage Vcc is applied to the control gate, electrons are implanted into the floating gate by Fowler-Nordheim tunneling, increasing a threshold level and thereby completing a write operation.

When data is erased, however, a high voltage is applied to the substrate and the ground is applied to the control gate, resulting in electrons being emitted from the floating gate to the substrate completing the erase operation.

Therefore, a high voltage must be applied to the control gate of the memory cell or the substrate to implant or emit electrons into the memory cell of the non-volatile semiconductor memory device.

The high control gate voltage must be able to be applied to the memory cell through a memory cell decoder that selects a memory cell.

FIG. 1 is a circuit diagram showing the memory cell decoder of a non-volatile semiconductor memory device. A row decoder for decoding the row address of the non-volatile semiconductor memory device includes a plurality of unit decoders (hereinafter, the memory cell decoders). The memory cell decoders include a string structure that is applied to an electrically erasable and programmable read-only memory (EEPROM) in the form of an AND operation.

Referring to FIG. 1, a memory cell decoder 10 includes a logic gate 1, a transmission controller M1, a charge pump 7, a word line enable signal line WLEN[0:n], and transmission transistors M0 through Mn. The memory cell decoder 10 includes a transistor M5 for driving a string select line SSL, a transistor M4 for applying ground GND to the string select line SSL when a memory cell decoder is not selected, and a transistor M8 for driving a ground select line GSL.

The logic gate 1 decodes an address Add for selecting a memory cell that is to be written, read, or programmed. When the memory cell is selected by the input address Add, the voltage at a node N1 becomes the supply voltage Vcc. When the memory cell is not selected, the voltage of the node N1 becomes GND (for example, 0V).

The transmission controller M1 is formed of a depletion type NMOS transistor. The transmission controller M1 controls the voltage of the node N1 being transmitted to node N2 responsive to a control clock nBLKSHF.

When the transistor M2 and M3 are turned on responsive to the voltage at node N2, the charge pump 7 transmits a high voltage signal Vpp higher than the supply voltage Vcc generated by a high voltage generator (not shown).

The word line enable signal WLEN[0:n] is an output signal of a word line driver (not shown). Also, the signal WLEN[0:n] is a voltage signal that swings higher than the supply voltage Vcc. The gates of the transmission transistors M0 through Mn are turned on responsive to the signal at node N2 boosted to a high voltage signal and transmits the signal WLEN[0:n] to the corresponding word line WL[0] through WL[n].

As the semiconductor memory devices become more integrated and the area of a unit memory cell is reduced, layout space for the memory cell decoder is likewise reduced.

The charge pump 7 includes a capacitor C for applying a high voltage signal VPP to the memory cell. The layout area utilized by the capacitor C is significantly larger, in turn, increasing the layout area of the charge pump 7.

Also, as the operation source of the semiconductor memory device becomes smaller, the operation characteristics of the charge pump 7 deteriorates.

SUMMARY OF THE INVENTION

It is an object of the present invention to overcome the disadvantages associated with prior art memory cell decoders and non-volatile semiconductor memory devices including memory cell decoders.

It is another object of the present invention to provide a method for reducing layout area of a memory cell decoder without deteriorating the operation characteristics even at a low supply voltage. A memory cell decoder using the method and a non-volatile semiconductor memory device including inventive the memory cell decoder are also provided.

To achieve the first object, there is provided a memory cell decoder including a first node and a first transmitting portion adapted to output a high voltage signal to the first node responsive to a first selection signal. A control portion is adapted to generate a first control signal responsive to an address and discharge the first node responsive to the first control signal. A second transmitting portion is adapted to output a word line enable signal responsive to the first selection signal and the first control signal.

The control portion includes the following: a first logic gate adapted to generate a first logic gate signal by logically manipulating the address; a second logic gate adapted to generate the first control signal by logically manipulating the first logic gate signal and a second control signal; an inverter for inverting the first control signal; and a discharge circuit adapted to discharge the first node responsive to the inverted first control signal.

The high voltage signal has a voltage higher than that of a supply voltage. The first selection signal is generated from a first pre decoder adapted to decode the address.

The first transmitting portion comprises a MOS transistor having a first and second stages and a gate, the first stage receiving the high voltage signal, the second stage being connected to the first node, and the gate receiving the first selection signal.

The first transmitting portion includes: a first MOS transistor having a first and second stages and a gate, the gate receiving the first selection signal and the second stage being connected to the first node; and a second MOS transistor having a first and second stages and a gate, the gate receiving a second selection signal, the first stage receiving the high voltage signal, and the second stage being connected to the first stage of the first MOS transistor.

The word line enable signal is generated by a second pre decoder adapted to decode the address. The word line enable signal has a voltage higher than that of a supply voltage.

The second transmitting portion includes a plurality of MOS transistors each having a first and second stages and a gate. The gate of each MOS transistor is connected to the first node. The second stage of each MOS transistor is connected to a corresponding word line. The first stage of each MOS transistor receives a corresponding word line enable signal. The memory cell decoder includes a clamping unit connected in parallel to the first transmitting portion and adapted to clamp a voltage at the first node. The clamping unit includes a MOS transistor having a first and second stages and a gate, the first stage and the gate being connected to the first node and the second stage receiving the high voltage signal. The clamping unit includes a plurality of serially connected MOS transistors forming a diode.

A semiconductor memory device includes: a memory cell array having an array of memory cells; a plurality of word lines corresponding to the memory cells; a plurality of memory cell decoders adapted to select word lines responsive to an address; a first pre decoder adapted to decode the address and generate a plurality of block selection signals, the block selection signals selecting predetermined corresponding blocks in the memory cell decoders; a second pre decoder adapted to generate a plurality of word line enable signals responsive to the address, the word line enable signals for enabling corresponding word lines responsive to the address.

Each memory cell decoder includes: a first node; a first transmitting portion adapted to output a high voltage signal to the first node responsive to a first selection signal; a control portion adapted to generate a first control signal responsive to the address and discharge the first node responsive to the first control signal; a second transmitting portion adapted to transmit the word line enable signals responsive to the first selection signal and the first control signal.

A method of supplying a high voltage to a memory cell array of a non-volatile semiconductor memory device includes: generating a first control signal by decoding an address; transmitting a first high voltage to a first node of a plurality of memory cell decoders responsive to a corresponding first selection signal; selecting memory cell decoders from the plurality of memory cell decoders; discharging the first node corresponding to unselected memory cell decoders of the plurality of memory cell decoders responsive to first control signal; providing the first high voltage transmitted to the first node to a second transmitting portion of the selected memory cell decoders; and transmitting a second high voltage to a word line through the second transmitting portion responsive to the first high voltage.

The method includes generating the first high voltage with a high voltage generator. The method further includes boosting the first high voltage when the second high voltage is transmitted to the word line through the second transmitting portion.

Transmitting the first high voltage to the output stage of the first transmitting portion occurs responsive to a control signal.

The first transmitting portion of each of the respective cell decoders is controlled by a plurality of block selection signals.

The method includes clamping the first high voltage.

BRIEF DESCRIPTION OF THE DRAWING(S)

The above object and advantages of the present invention will become more readily apparent by describing in detail an embodiment with reference to the attached drawings.

DESCRIPTION OF THE PREFERRED EMBODIMENTS

Figure 1:
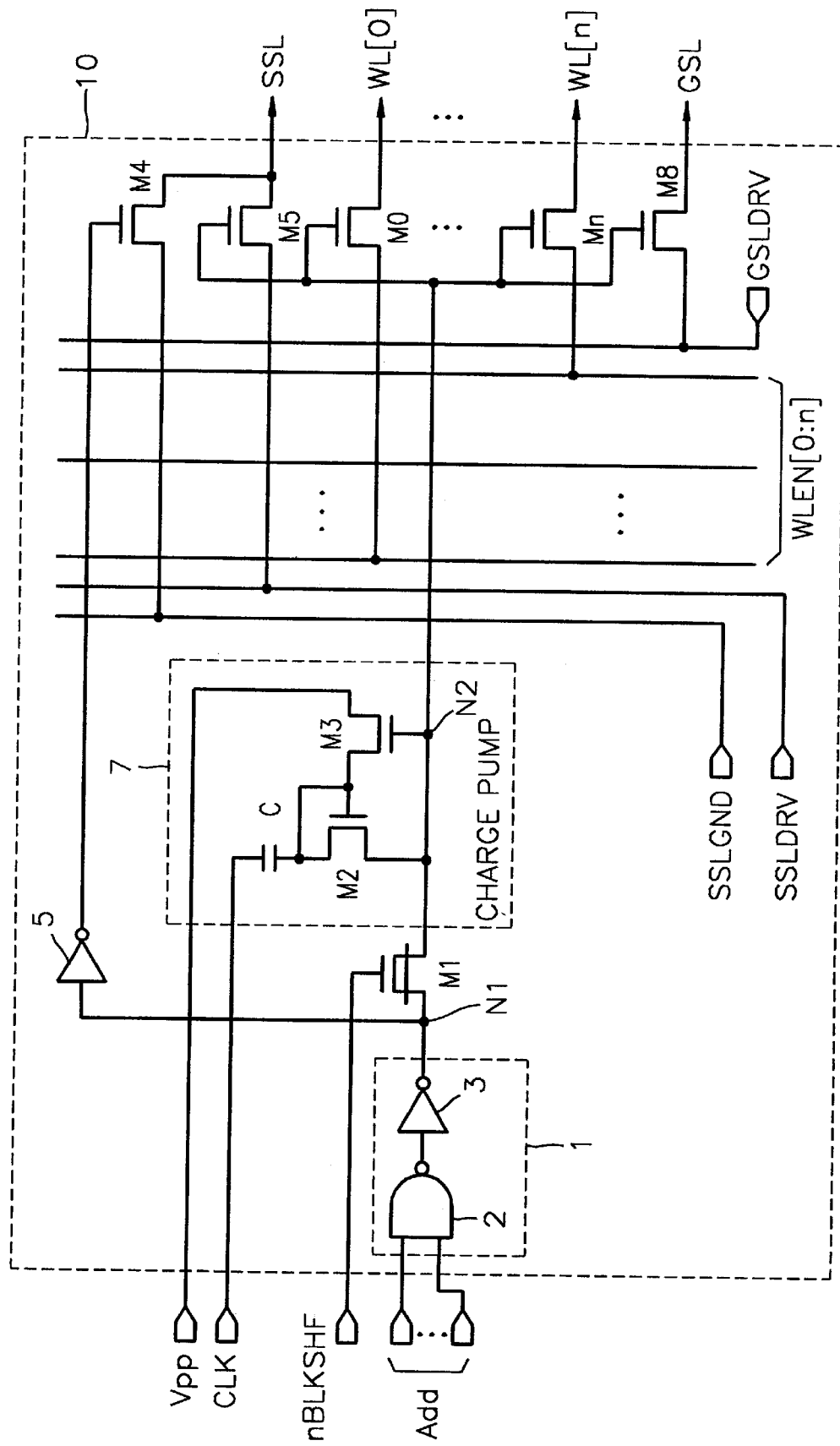
FIG. 1 is a circuit diagram of a memory cell decoder of a non-volatile semiconductor memory device.

The present invention now will be described more fully with reference to the accompanying drawings in which preferred embodiments of the invention are shown. The same reference numerals in different drawings represent the same or similar elements.

Figure 2:
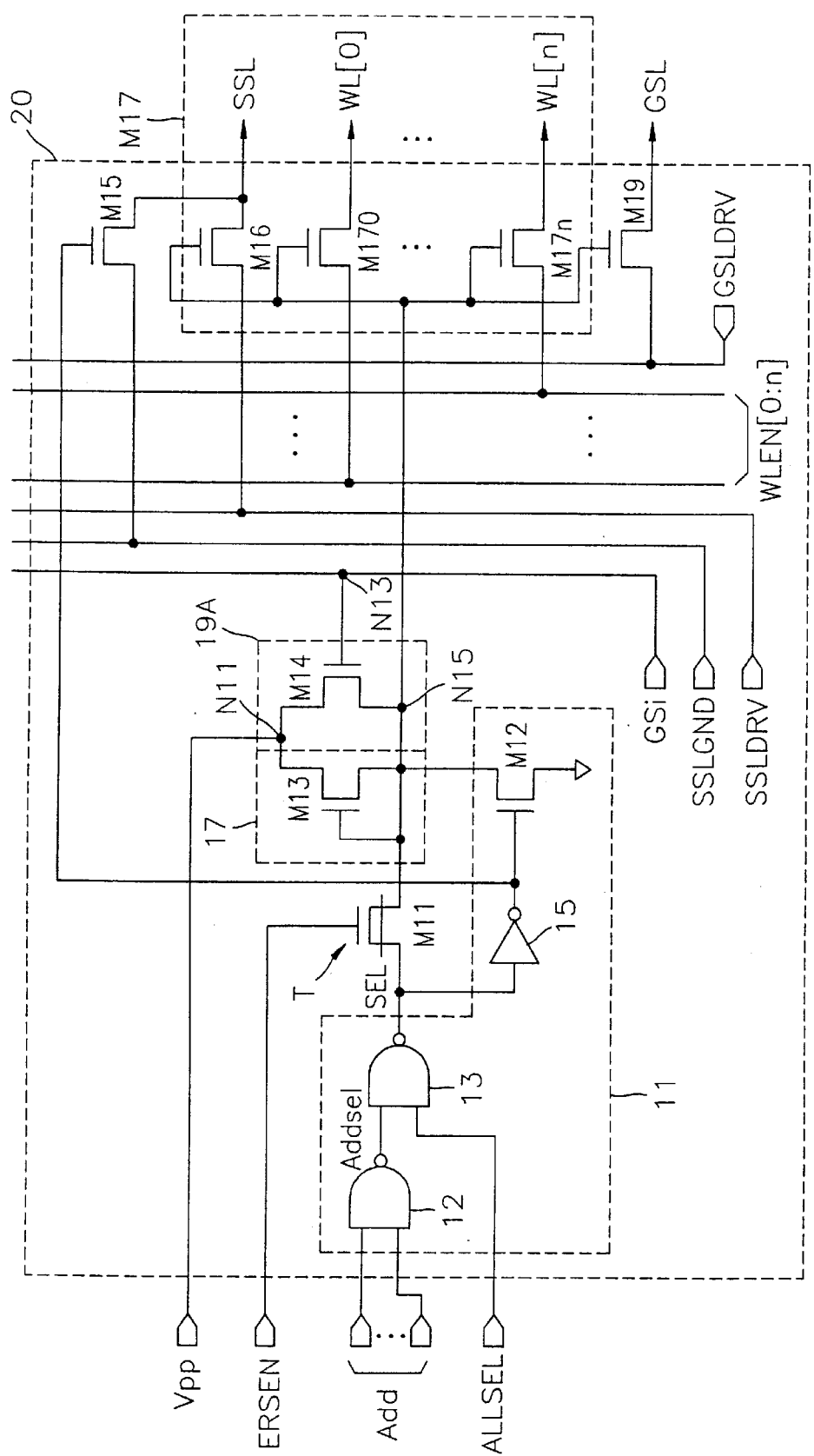
FIG. 2 is a circuit diagram of a memory cell decoder according to an embodiment of the present invention.

FIG. 2 is a circuit diagram of a memory cell decoder according to an embodiment of the present invention. Referring to FIG. 2, memory cell decoder includes a first node N15, a first transmitter 19A, second transmitters M17, and a control circuit 11. The memory cell decoder 20 further comprises a clamping unit 17 and a connector T.

The memory cell decoder 20 further comprises a transistor M15 for applying a voltage ground Vss or GND to the string select signal SSL and a transistor M19 for driving a ground select line (GSL).

The first transmitter 19A includes a node N11 for receiving a high voltage signal Vpp, a node N13 for receiving a selection signal GSi, and the node N15. The high voltage signal has Vpp has a higher voltage than a supply voltage Vcc.

The first transmitter 19A includes a MOS transistor M14 having a drain, a gate, and a source. The drain is connected to a node N11, whose gate is connected to a node N13, and whose source is connected to a node N15.

The first selection signal GSi is enabled or activated (for example, transited to a logic high level) when an address signal Add is decoded and the memory cell decoder 20 is selected and is deactivated when the memory cell decoder 20 is not selected.

When the selection signal GSi is activated, the transistor M14 is turned on and the high voltage signal Vpp is transmitted to the node N15. The high voltage signal Vpp, is generated by a voltage generator (not shown).

The second transmitters M17 provides a word line enable signal WLEN[0:n] to the word lines WL[0] through WL[n] connected to a gate of the memory cell of the memory cell array (not shown) of a non-volatile semiconductor memory device responsive to the signal at node N15.

The second transmitters M17 include a plurality of NMOS transistors M170 ... M17n. The gates of the NMOS transistors M170 ... M17n are connected to node N15. The sources of the NMOS transistors M170 ... M17n are connected to corresponding word lines WL[0] through WL[n] of the memory cell. The word line enable signal WLEN[0:n] is applied to the drains of the NMOS transistors M170 ... M17n.

The control circuit 11 includes a first logic gate 12, a second logic gate 13, a third logic gate 15, and an NMOS transistor M12. The first logic gate 12 is a NAND gate and outputs a signal Addsel for selecting the memory cell decoder 20 responsive to the address Add. When the memory cell decoder 20 is selected, the signal Addsel is deactivated (for example, transited to a logic low level). When the memory cell decoder 20 is not selected, the signal Addsel is activated (for example, transited to the logic high level).

The second logic gate 13 outputs a first control signal SEL obtained by inverting the signal Addsel responsive to the signal Addsel.

Therefore, when the memory cell decoder 20 is selected responsive to the address Add, the first control signal SEL is activated (for example, transited to the logic high level. When the memory cell decoder 20 is not selected, the control signal SEL is deactivated (for example, transited to logic low level).

The second logic gate 13 operates responsive to a second control signal ALLSEL for controlling the selection of the memory cell decoder 20 regardless of the address Add.

The second logic gate 13 of the control circuit 11 is a NAND gate. When the control signal ALLSEL is deactivated (for example, transited to the logic low level), the first control signal SEL is activated regardless of the address Add. However, when the control signal ALLSEL is activated (for example, transited to the logic high level), the first control signal SEL is activated only when the signal Addsel is deactivated (for example, transited to the logic low level).

The third logic gate 15 is an inverter and outputs an inverted version of the first control signal SEL to the gate of an NMOS transistor M12 responsive to the first control signal SEL. When the first control signal SEL is deactivated, the NMOS transistor M12 is turned on and discharges the voltage of the node N15 to ground voltage GND.

When the first selection signal GSi is activated and the node N15 is boosted to a high voltage signal Vpp, if the first control signal SEL is deactivated, the NMOS transistor M12 is turned on and the high voltage signal of the node N15 is discharged to GND. Conversely, if the first control signal SEL is deactivated, ground voltage Vss or GND is applied to the SSL when the NMOS transistor M15 is turned on responsive to the output signal of the inverter 15.

A clamping unit 17 is connected in parallel to the first transmitter 19A. The first clamping unit 17 prevents the high voltage signal Vpp applied to the node N15 from excessively increasing. The clamping unit 17 includes a MOS transistor M13 having a drain, a gate, and a source. The drain is connected to the node N11, the gate is connected to the node N15, and the source is connected to the node N15.

In one embodiment, the clamping unit 17 comprises a plurality of MOS transistors (not shown) in the form of a diode, in which the gate and the source are serially connected to the drain of the MOS transistor (not shown) of a front stage.

The connector T provides the first control signal SEL to the node N15 responsive to a third control signal ERSEN. The third control controls signal ERSEN for controlling erasing data. The connector T includes a depletion N-type MOS transistor M11, whose drain is connected to the output terminal of the second logic gate 13, whose gate receives the third control signal ERSEN, and whose source is connected to the node N15.

The third control signal ERSEN is activated in the case of the erasing of data and is deactivated (for example, transited to logic low) in other cases. The first control signal SEL is transmitted to the node N15 during programming of data but not during erasing of data.

Figure 3:
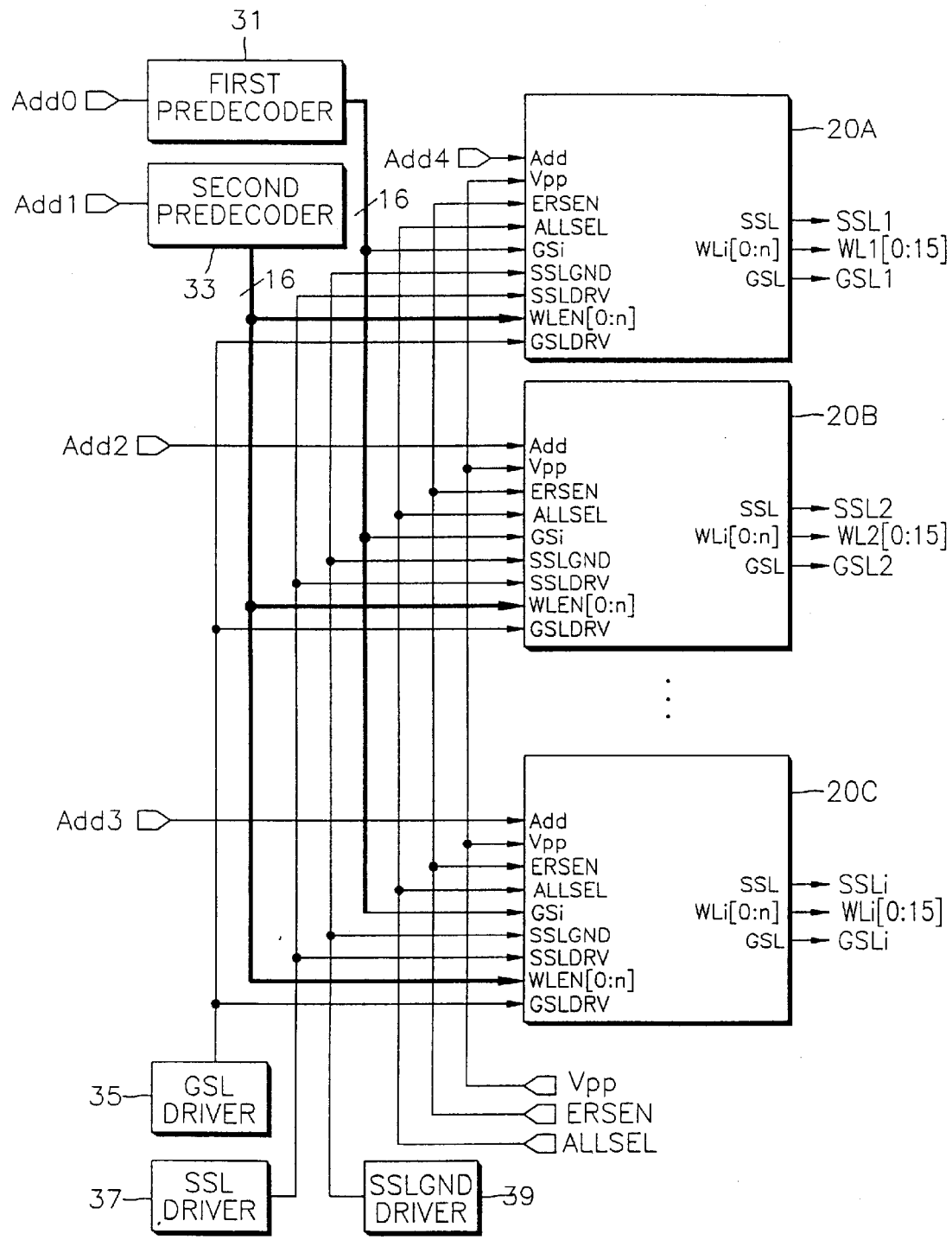
FIG. 3 is a block diagram showing a non-volatile semiconductor memory device including the memory cell decoder shown in FIG. 2.

FIG. 3 is a block diagram showing a non-volatile semiconductor memory device including a memory cell decoder according to an embodiment of the present invention. Referring to FIG. 3, the non-volatile semiconductor memory device includes an address decoder including a plurality of memory cell decoders 20A, 20B, and 20C, a first pre decoder 31, and a second pre decoder 33, a GSL driver 35, an SSL driver 37, and an SSLGND driver 39.

Each of the memory cell decoders 20A, 20B, and 20C have a structure similar to that of decoder 20 shown in FIG. 2.

The first pre decoder 31 decodes an address Add0 and outputs the first selection signal GSi for selecting a predetermined unit number of memory cell decoders (for example, 1/N of all the memory cell decoders; N is a natural number, e.g., 16) among all the memory cell decoders.

When it is assumed that a predetermined unit number of memory cell decoders 20A, 20B, and 20C are selected by the first pre decoder 31, the first selection signal GSi output to the memory cell decoders 20A, 20B, and 20C are activated and the first selection signal GSi output to the remaining predetermined unit number of memory cell decoders (not shown), which are not selected, are deactivated.

The second pre decoder 33 decodes the address Add1 and outputs N, e.g., 16, word line enable signals WELN[0:n] to the memory cell decoders 20A, 20B, and 20C.

The GSL driver 35 generates a number of predetermined signals. For example, the GSL driver 35 outputs the high voltage signal Vpp during reading of data, the supply voltage Vcc during erasing of data, and ground signal GND during programming of data to the memory cell decoders 20A, 20B, and 20C to drive the signal GSL.

In order to drive the signal SSL, the SSL driver 37 generates a predetermined signal. For example, the SSL driver 37 outputs the supply voltage Vcc during programming of data to the memory cells 20A, 20B, and 20C and the SSLGND driver 39 supplies the ground signal GND after the SSL completes an operation.

In general, the high voltage signal Vpp, which is generated by the high voltage generator and is higher than the supply voltage Vcc of the non-volatile semiconductor memory device, outputs a positive high voltage signal (for example, 20V) during the programming of data and a negative high voltage signal (for example –20V) during the erasing of data to the memory cell decoders 20A, 20B, and 20C.

Figure 6:
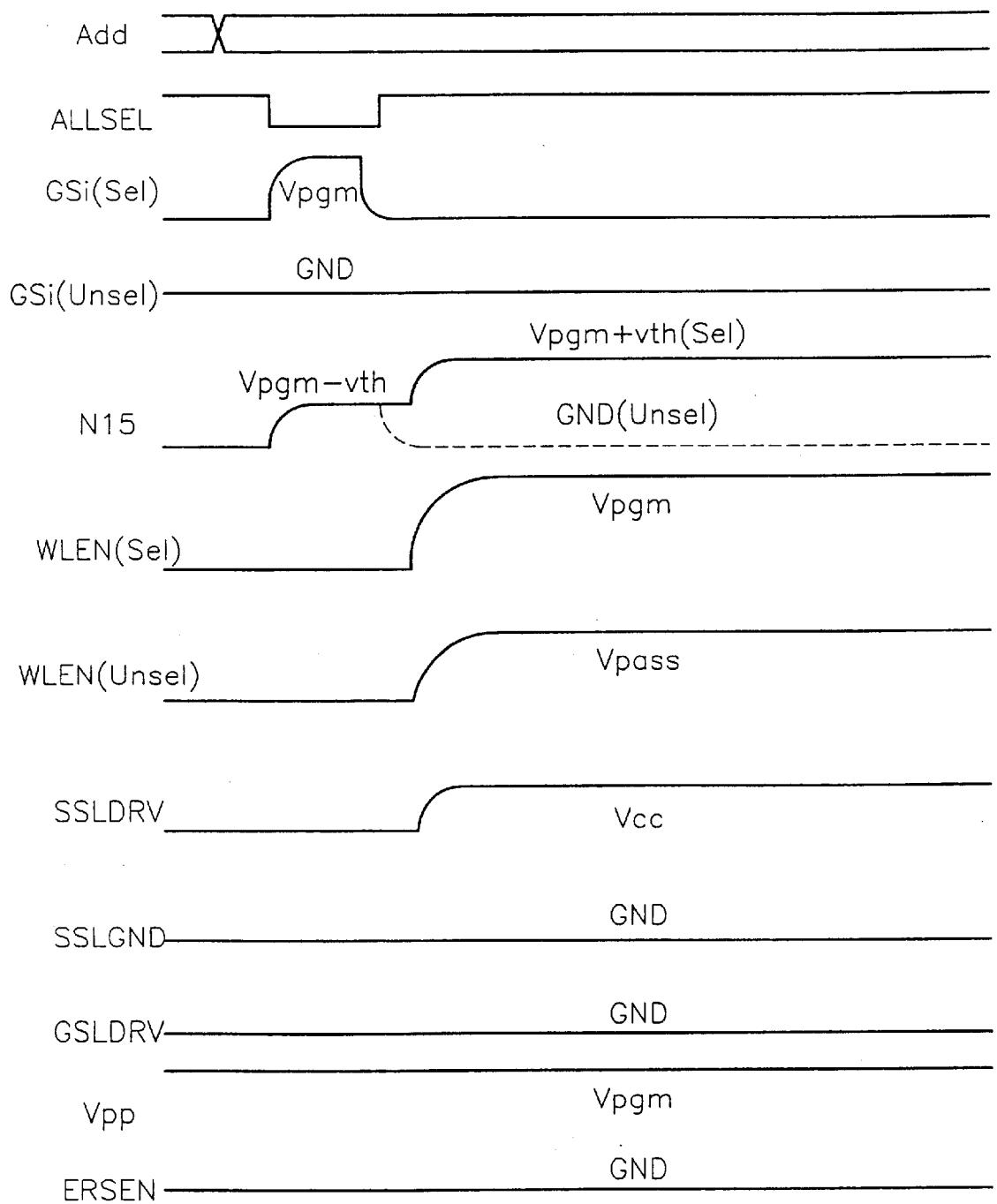
FIG. 6 is a timing diagram of the memory cell decoder according to the embodiment of the present invention.

FIG. 6 is a timing diagram of the operation of a memory cell decoder according to the embodiment of the present invention. The operations of the memory cell decoder according to the present invention and the non-volatile semiconductor memory device will be described in detail with reference to FIGS. 2, 3, and 6.

The first pre decoder 31 decodes the address Add0 and outputs the first selection signal GSi for selecting the memory cell decoders 20A, 20B, and 20C.

When the memory cell decoders 20A, 20B, and 20C are selected by the first pre decoder 31, the signal GSi (SEL) input to the memory cell decoders 20A, 20B, and 20C is a high voltage signal Vpgm.

However, the signal GSi (Unsel) input to unselected memory cell decoders is the ground signal GND.

Therefore, when the high voltage signal Vpgm is applied to the node N13 by the signal GSi (SEL) input to the memory cell decoders 20A, 20B, and 20C, the transistor M14 is turned on. Therefore, a high voltage signal (Vpgm−Vth) corresponding to a difference between the high voltage signal Vpgm and the threshold voltage Vth of the transistor M14 is precharged to the node N15.

The second pre decoder 33 decodes the address Add1 and outputs the word line enable signal WLEN[0:n] to the memory cell decoders 20A, 20B, and 20C. At this time, the high voltage signal Vpgm is applied to the selected word line enable signal WLEN (Sel). The high voltage signal Vpass is applied to the signal WLEN (Unsel) corresponding to unselected word lines. The high voltage signal (Vpass) is lower than the signal Vpgm and higher than the supply voltage Vcc.

The control circuit 11 of the memory cell decoder 20A decodes an input address Add4 and outputs the activated first control signal SEL when the memory cell decoder 20A is selected.

During the programming of data, since the third control signal ERSEN is deactivated to the ground signal GND, the activated first control signal SEL is transmitted to the node N15.

In this case, since the signal at node N15 is precharged to Vpgm−Vth, the transistor M15 and the transistors M17 and M18 of the second transmitter is turned on responsive to the voltage Vpgm−Vth of the node N15.

Therefore, as the Vpgm is applied to WLEN (sel) or the Vpass is applied to the WLEN (Unsel), the signal at node N15 rises to Vpgm+Vth by the boosting effect due to parasitic capacitance between the source and the drain of the transistors M17 and M18 and the node N15.

Also, capacitance can be included between the node N15 and the transistors M17 and M18. The signal of the node N15 can be risen to Vpgm+Vth due to the boosting effect caused by capacitance. Since the output signal of the SSLDRV is activated, the SSL is driven.

Therefore, when the first selection signal GSi and the first control signal SEL are activated, the word line enable signal WLEN[0:n] is output to the memory cells without voltage reduction.

Where the control circuit 11 outputs the first control signal SEL responsive to the second control signal ALLSEL will be briefly described.

In the case of the programming of data, when the second control signal ALLSEL is transited from an activation state (for example, the logic high level) to a deactivation state (for example, the logic low level) for a predetermined section, the first control signal (SEL) of the memory cell decoders 20A, 20B, and 20C is activated regardless of the input address Add2 through Add4.

When the output signal GSi of the first pre decoder 31 is activated responsive to the address Add0, since the voltage of the node N15 of the memory cell decoders 20A, 20B, and 20C is precharged to Vpgm−Vth, the transistors M16 and M17 are turned on. Accordingly, the word line enable signal WLEN[0:n] is output to the word lines WL[0] through WL[n] of the memory cell.

When the signal ALLSEL changes from the activation to the deactivation states and the memory cell decoder 20A is selected by the address Add4 and the first control signal SEL of the selected memory cell decoder 20A is activated, the voltage at node N15 is maintained at Vpgm−Vth.

However, since the first control signal SEL is deactivated because the cell decoders 20B and 20C were not selected by the address Add4, the transistor M12 is turned on and the voltage at node N15 is discharged.

Therefore, when the first selection signal GSi and the first control signal SEL are activated, the word line enable signal WLEN[0:n] is output to the memory cells without voltage reduction.

Figure 4:
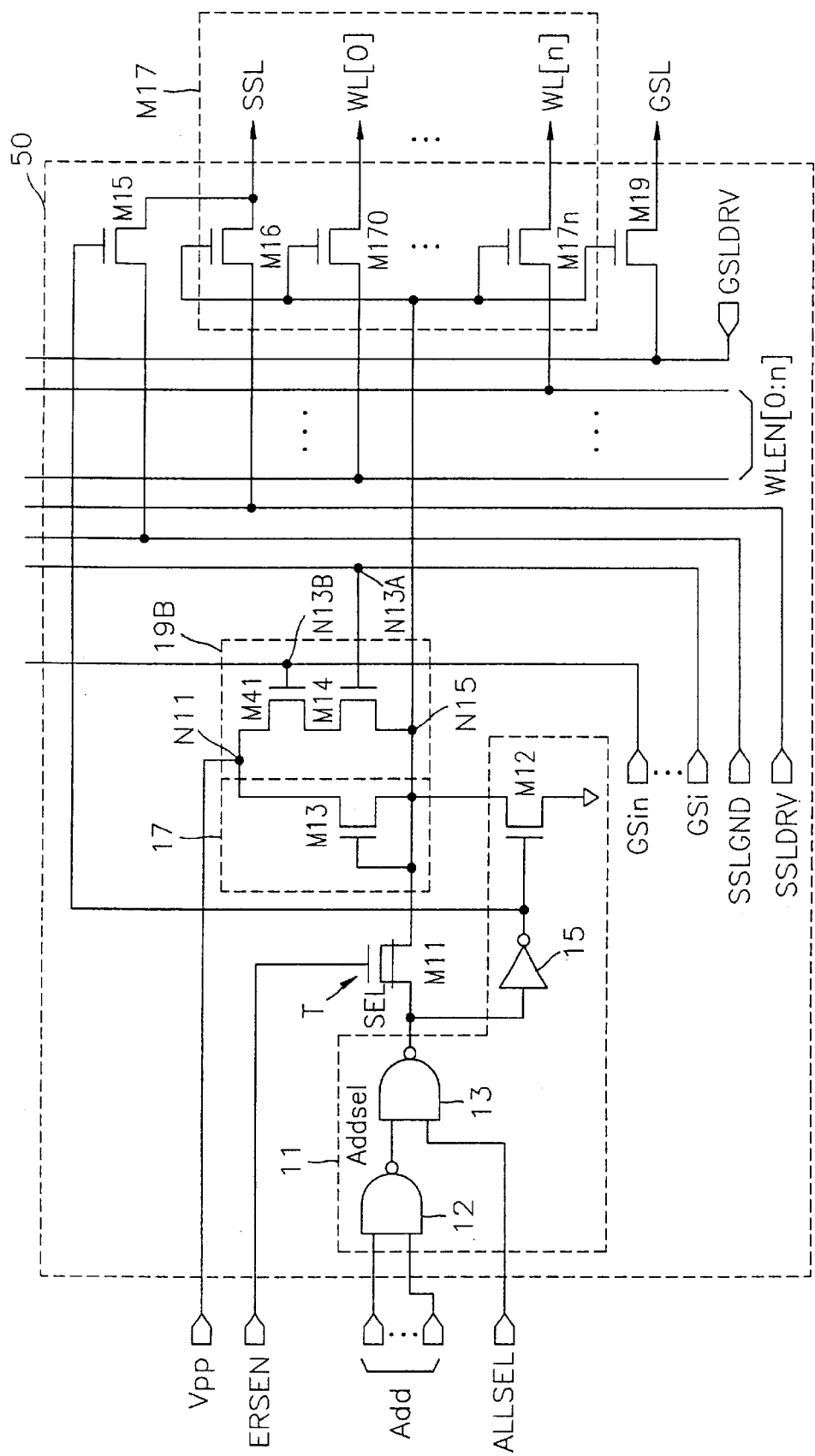
FIG. 4 is a circuit diagram showing a memory cell decoder according to another embodiment of the present invention.

FIG. 4 is a circuit diagram of a memory cell decoder according to another embodiment of the present invention. Referring to FIG. 4, the structure of each of memory cell decoder 50 is the same as the structure of memory cell decoder 20 shown in FIG. 2 excluding that the memory cell decoders 50A, 50B, and 50C include a first transmitter 19B.

The first transmitter 19B transmits the high voltage signal Vpp to node N15 responsive to the first selection signal GSi and the second selection signal GSin.

The first transmitter 19B includes a transistor M41 whose drain is connected to node N11 and whose gate N13B receives the second selection signal GSin input. The first transmitter 19B also includes a transistor M14 whose source is connected to the node N15, whose gate N13A receives the first selection signal Gsi, and whose drain is connected to the source of the transistor M41.

The signal at node N15 is precharged to a voltage corresponding to the difference between the high voltage signal Vpp and the threshold voltage of the transistors M14 and M41, that is Vpgm−2Vth, when the first selection signal GSi and the second selection signal GSin are activated.

In the case of the programming of data, when the first control signal SEL is activated responsive to the address Add, the voltage at node N15 is maintained to be Vpgm−2Vth. Therefore, since the transistors M16 through M18 are turned on responsive to the voltage of the node N15, WLEN[0:n] is output to be WL[0] through WL[n]. However, when the first control signal SEL is deactivated, the transistor M12 is turned on and the signal of the node N15 is discharged to GND.

When the program voltage Vpgm is applied to the word line enable signal WLEN (sel) or when the voltage Vpass is applied to the word line enable signal WLEN (Unsel), the voltage at node N15 increases to the program voltage Vpgm by the boosting effect caused by the parasitic capacitance between the source of each of the transistors M17 and M18 and the node N15 and the drain of each of the transistors M17 and M18 and the node N15.

It is possible to include the capacitance between the node N15 and the respective transistors M17 and M18. The voltage of the node N15 can increase to the program voltage Vpgm due to the boosting effect caused by the capacitance. Since the output signal of the SSLDRV is activated, the signal SSL is driven.

Therefore, when the first selection signal GSi, the second selection signal GSin, and the first control signal SEL are activated, the word line enable signal WLEN[0:n] is output to the word line of the memory cell WL[0] through WL[n] responsive to the signal at node N15.

Figure 5:
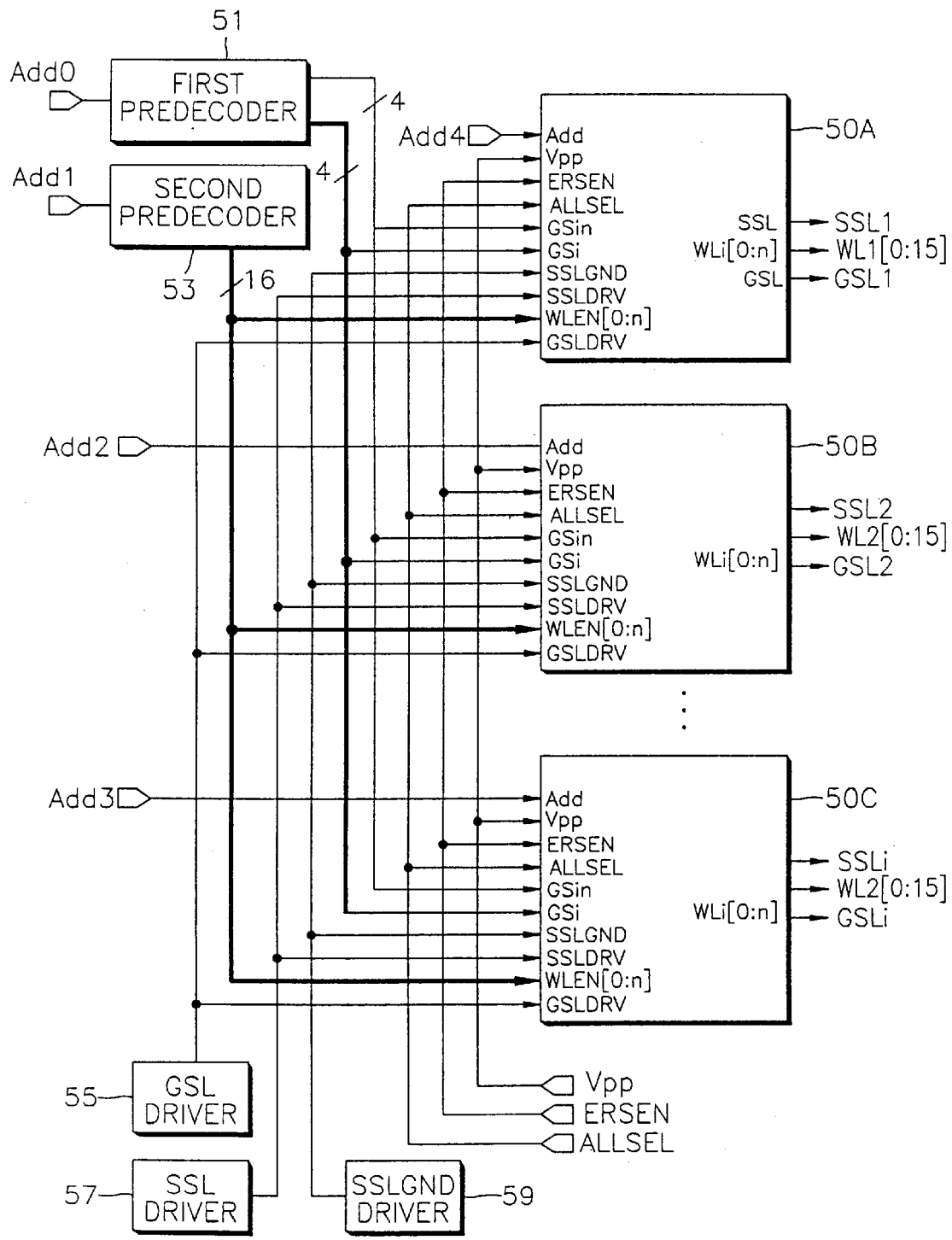
FIG. 5 is a block diagram of a non-volatile semiconductor memory device including the memory cell decoder shown in FIG. 4.

FIG. 5 is a block diagram showing a non-volatile semiconductor memory device including a memory cell decoder according to another embodiment of the present invention.

Referring to FIG. 5, the non-volatile semiconductor memory device includes an address decoder including a plurality of memory cell decoders 50A, 50B, and 50C, a first pre decoder 51, and a second pre decoder 53, a GSL driver 55, an SSL driver 57, and an SSLGND driver 59. Each of memory cell decoders 50A, 50B, and 50C have a structure similar to decoder 50 shown in FIG. 4.

Referring to FIG. 5, the structure of the first pre decoder 51 is the same as the structure as shown in FIG. 3 excluding that the output signal of the first pre decoder 51 outputs the first selection signal GSi and the second selection signal GSin. Hereinafter, only the portion related to the first pre decoder 51 will be described.

The first pre decoder 51 decodes the address Add0 and outputs the first selection signal GSi for selecting the memory cell decoders whose number is 1/N, e.g. 1/4, of the number of the entire memory cell decoders. The first pre-decoder 51 decodes the second selection signal GSin for selecting the memory cell decoders whose number is 1/N, e.g. 1/4, of the number of the entire memory cell decoders.

When it is assumed that the memory cell decoders 50A, 50B, and 50C are selected among the entire memory cell decoders of the address decoder by the first selection signal GSi and the second selection signal GSin, the first selection signal GSi and the second selection signal GSin, which are input to the memory cell decoders 50A, 50B, and 50C are at the high voltage signal Vpgm.

However, the first selection signal GSi and the second selection signal GSin, which are input to unselected memory cell decoders, are connected to the ground signal GND.

Therefore, when the first selection signal GSi, the second selection signal GSin, and the first control signal SEL are activated, the word line enable signal WLEN[0:n] is output to the wordline WL[0] through WL[n], responsive to the signal at node N15.

A method of supplying a high voltage to the memory cell array of a non-volatile semiconductor memory device will be explained, taking the above-mentioned memory cell decoder and the semiconductor memory device including the memory cell decoder as examples. The method for providing a high voltage to the memory cell array of a non-volatile semiconductor memory device comprises decoding an address outputting at least one block selection signal to the memory cell decoders, and supplying the first high voltage to the output stage of the first transmitter of the respective cell decoders.

The cell decoders are selected by the selection signal. The first high voltage supplied to the output stages of the first transmitter of the unselected decoders is discharged. The first high voltage supplied to the output stage of the first transmitter of the selected decoders is supplied to the second transmitter. The second high voltage is supplied to the word line through the second transmitter.

The first high voltage is generated by the high voltage generator. The block selection signal is disabled during selecting the cell decoders. The first high voltage is preferably boosted to a voltage higher than the first high voltage at the point of time where the second high voltage is supplied to the second transmitter.

The first high voltage supplied to the output stage of the unselected cell decoder is discharged through the controller. The first transmitter of the cell decoders is controlled by a plurality of block selection signals. A clamp circuit for preventing the overvoltage of the output stage of the first transmitter is included.

As mentioned above, it is possible to reduce the layout area of the memory cell decoder and the high voltage signal is transmitted to the memory cell without deteriorating the operation characteristic even in a low operation power source.

While this invention has been particularly shown and described with reference to preferred embodiments thereof, it will be understood by those skilled in the art that various changes in form and details may be made therein without departing from the spirit and scope of the invention as defined by the following claims.

We claim:

1. A memory cell decoder, comprising:
a first node;
a first transmitting portion adapted to output a high voltage signal to the first node responsive to a first selection signal, the first selection signal being decoded from a first address;
a control portion adapted to generate a first control signal responsive to an address and discharge the first node responsive to the first control signal;
a second transmitting portion adapted to output a word line enable signal responsive to the first selection signal and the first control signal, the word enable signal being decoded from a second address.

2. A memory cell decoder, comprising:
a first node;
a first transmitting portion adapted to output a high voltage signal to the first node responsive to a first selection signal;
a control portion adapted to generate a first control signal responsive to an address and discharge the first node responsive to the first control signal; and
a second transmitting portion adapted to output a word line enable signal responsive to the first selection signal and the first control signal;
wherein the control portion comprises:
a first logic gate adapted to generate a first logic gate signal by logically manipulating the address;
a second logic gate adapted to generate the first control signal by logically manipulating the first logic gate signal and a second control signal;
an inverter for inverting the first control signal; and
a discharge circuit adapted to discharge the first node responsive to the inverted first control signal.

3. The memory cell decoder of claim 1 wherein the high voltage signal has a voltage higher than that of a supply voltage.

4. The memory cell decoder of claim 1 wherein the first transmitting portion comprises a MOS transistor having a first and second stages and a gate, the first stage receiving the high voltage signal, the second stage being connected to the first node, and the gate receiving the first selection signal.

5. The memory cell decoder of claim 1 wherein the word line enable signal has a voltage higher than that of a supply voltage.

6. The memory cell decoder of claim 1
wherein the second transmitting portion comprises a plurality of MOS transistors each having a first and second stages and a gate;
wherein the gate of each MOS transistor is connected to the first node;
wherein the second stage of each MOS transistor is connected to a corresponding word line; and
wherein the first stage of each MOS transistor receives a corresponding word line enable signal.

7. The memory cell decoder of claim 1 comprising:
a clamping unit connected in parallel to the first transmitting portion and adapted to clamp a voltage at the first node.

8. The memory cell decode of claim 7 wherein the clamping unit comprises a MOS transistor having a first and second stages and a gate, the first stage and the gate being connected to the first node and the second stage receiving the high voltage signal.

9. The memory cell decoder of claim 7 wherein the clamping unit includes a plurality of serially connected MOS transistors forming a diode.

10. A memory cell decoder, comprising:
a first node;
a first transmitting portion adapted to output a high voltage signal to the first node responsive to a first selection signal;
a control portion adapted to generate a first control signal responsive to an address and discharge the first node responsive to the first control signal; and
a second transmitting portion adapted to output a word line enable signal responsive to the first selection signal and the first control signal;
wherein the first transmitting portion comprises:
a first MOS transistor having a first and second stages and a gate, the gate receiving the first selection signal and the second stage being connected to the first node; and
a second MOS transistor having a first and second stages and a gate, the gate receiving a second selection signal, the first stage receiving the high voltage signal, and the second stage being connected to the first stage of the first MOS transistor.

11. A semiconductor memory device, comprising:
a memory cell array having an array of memory cells;
a plurality of word lines corresponding to the memory cells;
a plurality of memory cell decoders adapted to select word lines responsive to an address;
a first pre decoder adapted to decode the address and generate a plurality of block selection signals, the block selection signals selecting predetermined corresponding blocks in the memory cell decoders;
a second pre decoder adapted to generate a plurality of word line enable signals responsive to the address, the word line enable signals for enabling corresponding word lines responsive to the address;
wherein each memory cell decoder comprises:
a first node;
a first transmitting portion adapted to output a high voltage signal to the first node responsive to a first selection signal, the first selection signal being decoded from a first address;
a control portion adapted to generate a first control signal responsive to the address and discharge the first node responsive to the first control signal;
a second transmitting portion adapted to transmit the word line enable signals responsive to the first selection signal and the first control signal, the word enable signal being decoded from a second address.

12. The semiconductor device of claim 11 wherein the control portion comprises:
a logic gate adapted to generate the first control signal responsive to the address;
an inverter adapted to invert the first control signal;
a discharge circuit adapted to discharge the first node responsive to the inverted first control signal.

13. The semiconductor device of claim 11 wherein the high voltage signal has a voltage higher than that of a supply voltage.

14. The semiconductor device of claim 11 wherein the first transmitting portion comprises a MOS transistor having a first and second stages and a gate, the first stage receiving the high voltage signal, the second stage being connected to the first node, and the gate receiving a corresponding block selection signal.

15. The semiconductor device of claim 11 wherein the word line enable signals have a voltage higher than that of the supply voltage.

16. The semiconductor device of claim 11
wherein the second transmitting portion comprises a plurality of MOS transistors each having a first and second stages and a gate;
wherein the gate of each MOS transistor is connected to the first node;
wherein the second stage of each MOS transistor is connected to a corresponding word line; and
wherein the first stage of each MOS transistor receives a corresponding word line enable signal.

17. The semiconductor device of claim 11 wherein the first transmitting portion operates responsive to the plurality of block selection signals.

18. The semiconductor device of claim 11 comprising:
a clamping unit connected in parallel to the first transmitting portion and adapted to clamp a voltage at the first node.

19. The semiconductor device of claim 18 wherein the clamping unit comprises a MOS transistor having a first and second stages and a gate, the first stage and the gate being connected to the first node and the second stage receiving the high voltage signal.

20. The semiconductor device of claim 18 wherein the clamping unit includes a plurality of serially connected MOS transistors forming a diode.

21. A semiconductor memory device, comprising:
a memory cell array having an array of memory cells;
a plurality of word lines corresponding to the memory cells;
a plurality of memory cell decoders adapted to select word lines responsive to an address;
a first pre decoder adapted to decode the address and generate a plurality of block selection signals, the block selection signals selecting predetermined corresponding blocks in the memory cell decoders;
a second pre decoder adapted to generate a plurality of word line enable signals responsive to the address, the word line enable signals for enabling corresponding word lines responsive to the address;
wherein each memory cell decoder comprises:
a first node;
a first transmitting portion adapted to output a high voltage signal to the first node responsive to a first selection signal;
a control portion adapted to generate a first control signal responsive to the address and discharge the first node responsive to the first control signal;
a second transmitting portion adapted to transmit the word line enable signals responsive to the first selection signal and the first control signal; and
wherein the control portion comprises:

a first logic circuit adapted to generate a first logic signal by logically manipulating the address;

a second logic circuit adapted to generate a second selection signal by logically manipulating the first logic signal and a second control signal;

an inverting circuit adapted to invert the first control signal;

a discharge circuit adapted to discharge the first node responsive to the inverted first control signal.

22. A semiconductor memory device, comprising:

a memory cell array having an array of memory cells;

a plurality of word lines corresponding to the memory cells;

a plurality of memory cell decoders adapted to select word lines responsive to an address;

a first pre decoder adapted to decode the address and generate a plurality of block selection signals, the block selection signals selecting predetermined corresponding blocks in the memory cell decoders;

a second pre decoder adapted to generate a plurality of word line enable signals responsive to the address, the word line enable signals for enabling corresponding word lines responsive to the address;

wherein each memory cell decoder comprises:
a first node;
a first transmitting portion adapted to output a high voltage signal to the first node responsive to a first selection signal;
a control portion adapted to generate a first control signal responsive to the address and discharge the first node responsive to the first control signal;
a second transmitting portion adapted to transmit the word line enable signals responsive to the first selection signal and the first control signal; and
wherein the first transmitting portion comprises:
a first MOS transistor having a first and second stages and a gate, the gate receiving a corresponding block selection signal and the second stage being connected to the first node;
a second MOS transistor having a first and second stages and a gate, the gate receiving another block selection signal, the first stage receiving the high voltage signal, and the second stage being connected to the first stage of the first MOS transistor.

23. A method of supplying a high voltage to a memory cell array of a non-volatile semiconductor memory device, comprising:

generating a control signal by decoding an address;

generating a plurality of first selection signals by decoding a first address;

generating a word line enable signal by decoding a second address;

transmitting a first high voltage to a first node of a plurality of memory cell decoders responsive to a corresponding first selection signal;

selecting memory cell decoders from the plurality of memory cell decoders;

discharging the first node corresponding to unselected memory cell decoders of the plurality of memory cell decoders responsive to the control signal;

providing the first high voltage transmitted to the first node to a transmitting portion of the selected memory cell decoders; and transmitting the word line enable signal to a word line through the transmitting portion responsive to the first high voltage.

24. The method of claim 23 including generating the first high voltage with a high voltage generator.

25. The method of claim 23 including boosting the first high voltage when the second high voltage is transmitted to the word line through the transmitting portion.

26. The method of claim 23 wherein transmitting the first high voltage occurs responsive to a second control signal.

27. The method of claim 23 wherein the transmitting portion of each of the respective cell decoders is controlled by a plurality of block selection signals.

28. The method of claim 23 comprising clamping the first high voltage.

* * * * *